(12) United States Patent
Yosui et al.

(10) Patent No.: US 9,344,054 B2
(45) Date of Patent: May 17, 2016

(54) COMMON MODE FILTER

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP); Hisashi Akiyama, Nagaokakyo (JP)

(73) Assignee: Murata Manufacturing Co., Ltd., Kyogo (JP)

( * ) Notice: Subject to any disclaimer, the term of this patent is extended or adjusted under 35 U.S.C. 154(b) by 0 days.

(21) Appl. No.: 14/681,225

(22) Filed: Apr. 8, 2015

(65) Prior Publication Data

US 2015/0214915 A1    Jul. 30, 2015

Related U.S. Application Data

(63) Continuation of application No. PCT/JP2013/072951, filed on Aug. 28, 2013.

(30) Foreign Application Priority Data

Oct. 19, 2012 (JP) .................................. 2012-231313

(51) Int. Cl.
*H03H 7/01* (2006.01)
*H03H 7/09* (2006.01)
(Continued)

(52) U.S. Cl.
CPC .............. *H03H 7/0115* (2013.01); *H01P 1/20* (2013.01); *H03H 7/09* (2013.01); *H03H 7/1758* (2013.01); *H03H 7/1775* (2013.01); *H03H 7/427* (2013.01); *H03H 2001/0085* (2013.01)

(58) Field of Classification Search
CPC ..... H03H 7/0115; H03H 7/427; H03H 11/04; H03H 7/1775; H03H 2001/0085; H03H 7/09; H03H 7/1758
USPC ..................... 333/4, 5, 12, 168, 175, 181, 185
See application file for complete search history.

(56) References Cited

U.S. PATENT DOCUMENTS 4,456,985 A * 6/1984 Carsten ............... H04M 11/062
                                                        333/131
5,260,862 A * 11/1993 Marsh ............................. 363/39

(Continued)

FOREIGN PATENT DOCUMENTS

JP          60-96134 A       5/1985
JP          04-355902 A     12/1992

(Continued)

OTHER PUBLICATIONS

Official Communication issued in International Patent Application No. PCT/JP2013/072951, mailed on Oct. 29, 2013.

(Continued)

*Primary Examiner* — Robert Pascal
*Assistant Examiner* — Rakesh Patel
(74) *Attorney, Agent, or Firm* — Keating & Bennett, LLP

(57) ABSTRACT

A common mode filter includes, between ports, a differential transmission line including a first signal line and a second signal line. The first signal line includes a first inductor arranged in series, and the second signal line includes a second inductor arranged in series. In addition, a first resonant circuit is provided between the first end of the first inductor and the ground, and a second resonant circuit is provided between the first end of the second inductor and the ground.

14 Claims, 16 Drawing Sheets

(51) Int. Cl.
*H01P 1/20* (2006.01)
*H03H 7/42* (2006.01)
*H03H 1/00* (2006.01)

(56) References Cited

U.S. PATENT DOCUMENTS

| | | | |
|---|---|---|---|
| 5,304,967 A | 4/1994 | Hayashi | |
| 6,441,701 B1* | 8/2002 | Hernandez | H03M 7/1708 333/171 |
| 7,528,680 B2* | 5/2009 | Kebinger et al. | 333/181 |
| 2003/0076211 A1 | 4/2003 | Matsuta et al. | |
| 2003/0134612 A1 | 7/2003 | Nakayama et al. | |
| 2003/0147197 A1 | 8/2003 | Uriu et al. | |
| 2004/0155720 A1* | 8/2004 | Yasui et al. | 333/12 |
| 2007/0183131 A1* | 8/2007 | Jow et al. | 361/816 |
| 2007/0188265 A1* | 8/2007 | Perreault et al. | 333/181 |
| 2009/0174496 A1* | 7/2009 | Van Bezooijen | 333/17.3 |
| 2010/0039189 A1* | 2/2010 | Taniguchi | H01P 1/20345 333/185 |
| 2010/0277256 A1* | 11/2010 | Concord | 333/177 |
| 2013/0169380 A1 | 7/2013 | Tamaki | |

FOREIGN PATENT DOCUMENTS

| | | |
|---|---|---|
| JP | 07-106135 A | 4/1995 |
| JP | 2003-133135 A | 5/2003 |
| JP | 2006-33421 A | 2/2006 |
| JP | 2008-245037 A | 10/2008 |
| JP | 2012-019443 A | 1/2012 |
| JP | 2012-070279 A | 4/2012 |
| WO | 01/67470 A1 | 9/2001 |
| WO | 01/69710 A1 | 9/2001 |

OTHER PUBLICATIONS

Official Communication issued in corresponding Japanese Patent Application No. 2014-145892, mailed on May 26, 2015.

* cited by examiner

COMMON MODE FILTER

BACKGROUND OF THE INVENTION

1. Field of the Invention

The present invention relates to a common mode filter that significantly reduces common mode noise that propagates through a transmission line.

2. Description of the Related Art

In order to significantly reduce common mode noise that is to propagate through a differential transmission line, a common mode choke coil has been conventionally used. The common mode choke coil, as described in Japanese Unexamined Patent Application Publication No. 2003-133135, for example, includes two coils that are configured so that a magnetic field generated in each of the coils is canceled out by a differential mode signal (normal mode signal) and the magnetic field is increased with respect to a common mode signal (common mode noise).

In general, such a common mode choke coil is required that each coil has a large inductance value and that a coupling coefficient between the coils is large.

However, as the inductance value of a coil is increased and a coupling coefficient between coils is increased, a self-resonant frequency is decreased and the transmission loss of a signal is also increased. Therefore, it is difficult to use such a common mode choke coil for a differential transmission line that is used in a high frequency band and required to have a small transmission loss, like a differential transmission line for a high speed interface such as USB or HDMI (registered trademark).

SUMMARY OF THE INVENTION

Preferred embodiments of the present invention provide a common mode filter that, even with a small inductance and a small coupling coefficient, highly effectively reduces common mode noise, obtains satisfactory characteristics in a high frequency, and has a small transmission loss.

A common mode filter according to various preferred embodiments of the present invention includes a differential transmission line including a first signal line and a second signal line, a first inductance element arranged in series in the first signal line, a second inductance element arranged in series in the second signal line, and a ground as a reference with respect to the first signal line and the second signal line, and further includes a first resonant circuit arranged between the first inductance element and the ground, and a second resonant circuit arranged between the second inductance element and the ground.

Such a configuration achieves a high suppression effect on common mode noise, even with a small inductance and a small coupling coefficient.

The resonant frequencies of the first resonant circuit and the second resonant circuit preferably are different from each other. This widens the frequency band in which the suppression effect on common mode noise is obtained.

The first resonant circuit preferably is an LC series circuit and preferably includes a first capacitance element connected to the first inductance element, the second resonant circuit preferably is an LC series circuit and preferably includes a second capacitance element connected to the second inductance element, the first resonant circuit preferably further includes a third inductance element arranged between the first capacitance element and the second capacitance element, and a fourth inductance element arranged between the second capacitance element and the ground, and the second resonant circuit preferably further includes the fourth inductance element.

Such a configuration provides the first resonant circuit and the second resonant circuit of which the resonant frequencies are different from each other, with the small number of elements.

The first resonant circuit or the second resonant circuit preferably include an LC parallel circuit. This configuration separately provides an attenuation pole that attenuates common mode noise.

The differential transmission line preferably further includes a first port that is a first end on an input side of the differential transmission line, a second port that is a second end on the input side, a third port that is a first end on an output side of the differential transmission line, a fourth port that is a second end on the output side, a first port side inductance element arranged between the first port and the first inductance element, a second port side inductance element arranged between the second port and the second inductance element, a third port side inductance element arranged between the third port and the first inductance element, and a fourth port side inductance element arranged between the fourth port and the second inductance element.

The first inductance element, the second inductance element, the first resonant circuit, and the second resonant circuit preferably are integrated in a laminate including a plurality of base material layers laminated on each other. This provides a common mode filter in a limited space and achieves space saving.

The first inductance element and the second inductance element each preferably include an inductor electrode, the first capacitance element and the second capacitance element each preferably include a capacitor electrode, and the inductor electrode preferably is surrounded by the capacitor electrode. With such a configuration, even if another external electronic component or a metal body comes close to the common mode filter, which may cause variation in inductance value of the first inductance element and the second inductance element, the variation is significantly reduced.

The ground preferably include a mesh-shaped ground conductor or a grid-shaped ground conductor. Accordingly, this can reduce unnecessary capacitance to be generated between the first inductance element and the second inductance element, and the ground.

According to various preferred embodiments of the present invention, a common mode filter that achieves a high suppression effect on common mode noise in a high frequency and a small transmission loss is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
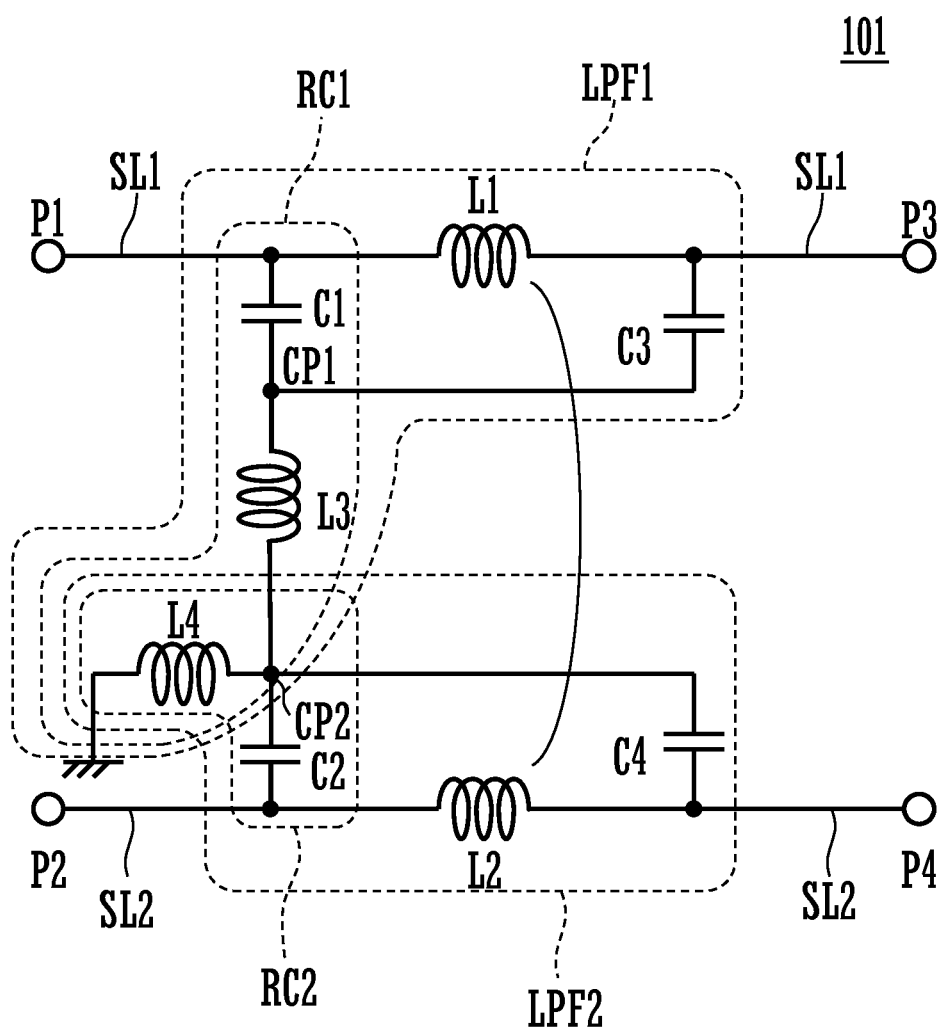
FIG. 1 is a circuit diagram of a common mode filter 101 according to a first preferred embodiment of the present invention.

Hereinafter, a plurality of preferred embodiments of the present invention will be described with reference to the attached drawings and several specific examples. In the drawings, components and elements assigned with the same reference numerals or symbols will represent identical components and elements. Each of the preferred embodiments is illustrative and the configuration shown in different preferred embodiments can be partially replaced and combined with each other.

First Preferred Embodiment

A common mode filter according to a first preferred embodiment of the present invention will be described with reference to the drawings. FIG. 1 is a circuit diagram of a common mode filter 101 according to the first preferred embodiment of the present invention.

The common mode filter 101 preferably includes a differential transmission line including a first signal line SL1 and a second signal line SL2 between a port (P1, P2) and a port (P3, P4). The first signal line SL1 includes a first inductance element (hereinafter referred to as a "first inductor") L1 arranged in series, and the second signal line SL2 includes a second inductance element (hereinafter referred to as a "second inductor") L2 arranged in series. In addition, the common mode filter 101 preferably includes a ground as a reference with respect to the first signal line SL1 and the second signal line SL2. Moreover, the common mode filter 101 also preferably includes a first resonant circuit RC1 arranged between a first end of the first inductance element L1 and the ground, and a second resonant circuit RC2 arranged between a first end of the second inductance element L2 and the ground.

Between the first signal line SL1 and the second signal line SL2, a series circuit including a first capacitance element (hereinafter referred to as a "first capacitor") C1, a third inductance element (hereinafter referred to as a "third inductor") L3, and a second capacitance element (hereinafter referred to as a "second capacitor") C2 is arranged, and a fourth inductance element (hereinafter referred to as a "fourth inductor") L4 is connected between a connection point of the third inductor L3 and the second capacitor C2 and the ground.

The first resonant circuit RC1 includes the first capacitor C1, the third inductor L3, and the fourth inductor L4, and the second resonant circuit RC2 includes the second capacitor C2 and the fourth inductor L4.

The resonant frequency of the first resonant circuit RC1 is determined by the circuit constant of the LC series circuit of the first capacitor C1, the third inductor L3, and the fourth inductor L4, and the resonant frequency of the second resonant circuit RC2 is determined by the circuit constant of the LC series circuit of the second capacitor C2 and the fourth inductor L4. In this preferred embodiment, the capacitances of the capacitors C1 and C2 preferably are equal, or substantially equal, so that the resonant frequency of the first resonant circuit RC1 and the resonant frequency of the second resonant circuit RC2 are different from each other.

The third capacitor C3 is connected between the connection point CP1 of the first capacitor C1 and the third inductor L3, and the second end of the first inductor L1. Similarly, the fourth capacitor C4 is connected between the connection point CP2 of the second capacitor C2 and the third inductor L3, and the second end of the second inductor L2. The capacitors C1 and C3 and the inductors L1, L3, and L4 define a low pass filter LPF1. In other words, the low pass filter LPF1 is arranged in a line including the first signal line SL1 and the ground. Similarly, the capacitors C2 and C4 and the inductors L2 and L4 define a low pass filter LPF2. In other words, the low pass filter LPF2 is arranged in a line including the second signal line SL2 and the ground. In a frequency band lower than the cutoff frequency of these low pass filters LPF1 and LPF2, the impedance of the inductors L3 and L4 are set to be lower than the impedance of the capacitors C1 and C3, so that the low pass filter LPF1 defines and functions as a CLC$\pi$ type low pass filter defined by the capacitors C1 and C3 and the inductor L1. Similarly, the low pass filter LPF2 defines and functions as a CLC$\pi$ u type low pass filter defined by the capacitors C2 and C4 and the inductor L2.

It is to be noted that the above description has been premised on the suppression of the propagation of the common mode noise incident from the port (P1, P2). In other words, with respect to the common mode noise incident from the port (P1, P2), the first resonant circuit RC1 and the second resonant circuit RC2 define and act as a trap filter to suppress the common mode noise from being propagated to the port (P3, P4). In FIG. 1, when common mode noise is incident from the port (P3, P4), the LC series circuit defined by the capacitor C3 and the inductors L3 and L4 defines and functions as the first resonant circuit, and the LC series circuit defined by the capacitor C4 and the inductor L4 defines and functions as the second resonant circuit. In this way, the arrangement of the capacitors C3 and C4 can not only configure low pass filters LPF1 and LPF2, but also allow a common mode filter to have bi-directionality.

Figure 2:
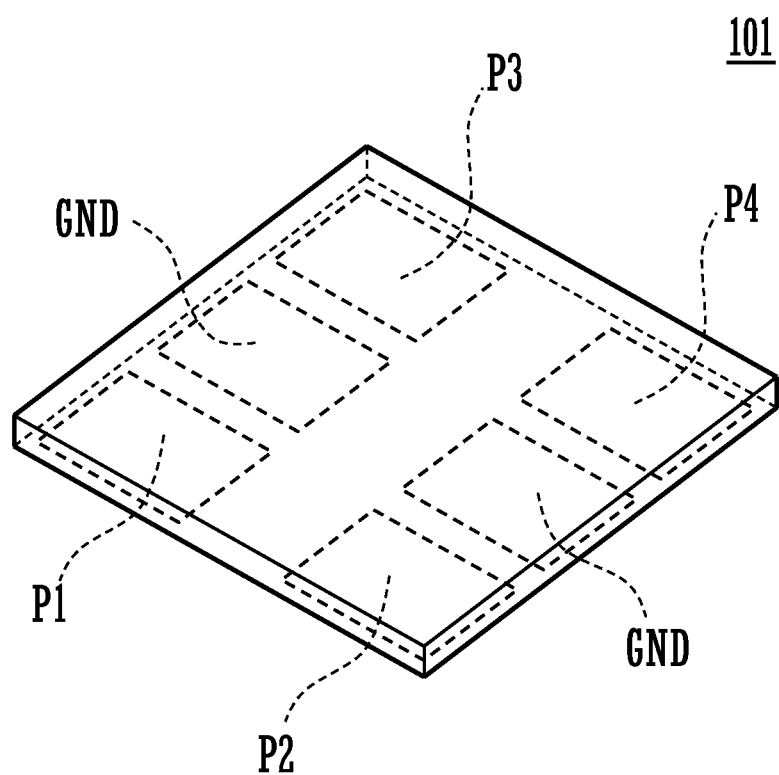
FIG. 2 is an appearance perspective view of the common mode filter 101.
Figure 3:
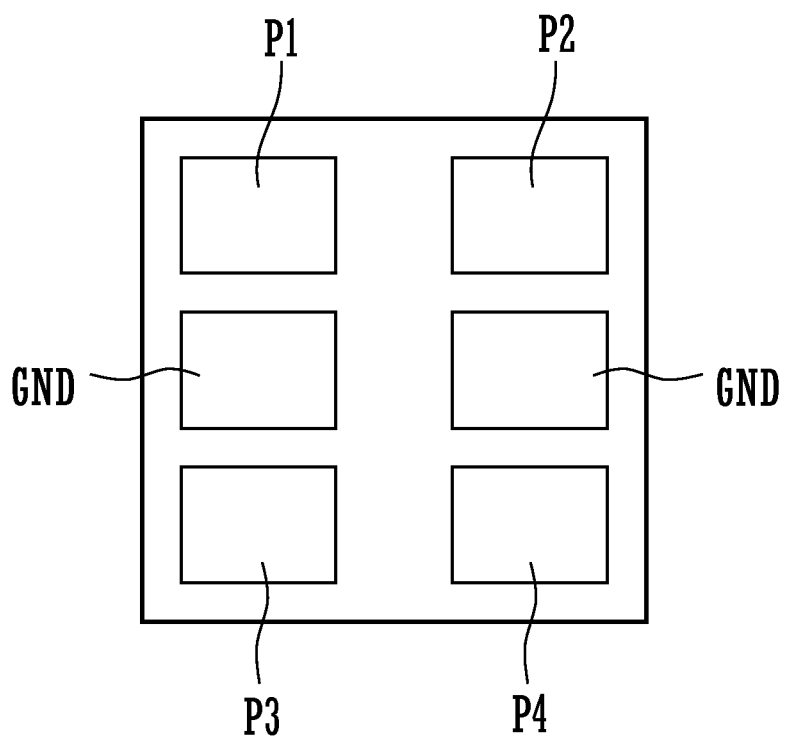
FIG. 3 is a bottom view of the common mode filter 101.

FIG. 2 is an appearance perspective view of the common mode filter 101, and FIG. 3 is a bottom view of the common mode filter 101. The common mode filter 101 is a laminate of base material layers including various conductor patterns to be described below. The common mode filter 101 includes ports P1 to P4 and a ground terminal GND on the bottom surface of the common mode filter 101.

Figure 4:
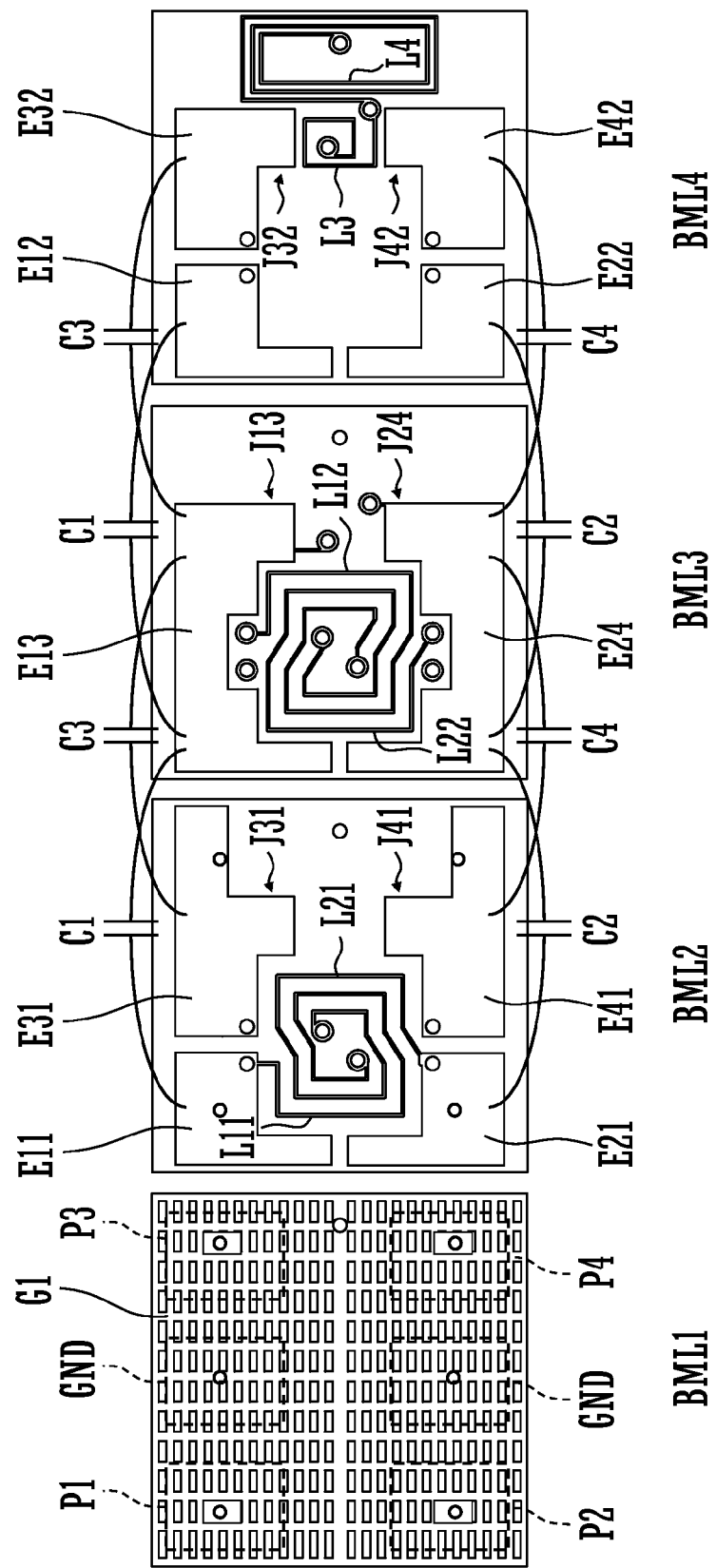
FIG. 4 is a plan view of each of pre-laminated base material layers of the common mode filter 101.

FIG. 4 is a plan view of each of pre-laminated base material layers. The common mode filter 101 is a laminate preferably including four base material layers BML1 to BML4 including various conductor patterns. The base material layers BML1 to BML4 are resin sheets, and the base material layer BML1 is the lowermost layer and the base material layer BML4 is the uppermost layer.

The top surface of the base material layer BML1 includes a mesh-shaped ground conductor G1. The bottom surface of the base material layer BML1 includes the ports P1 to P4 and the ground terminal GND that are shown in FIG. 3.

The base material layer BML2 includes inductor electrodes L11 and L21 and electrodes E11, E21, E31, and E41. The base material layer BML3 includes inductor electrodes L12 and L22 and electrodes E13 and E24. The base material layer BML4 includes inductor electrodes L3 and L4 and electrodes E12, E22, E32, and E42.

The first end of the inductor electrode L11 is electrically connected to the electrodes E11 and E12, and the second end of the inductor electrode L11 is connected to the first end of the inductor electrode L12 through a via conductor. The second end of the inductor electrode L12 is electrically connected to the electrodes E31 and E32 through the via conductor. The first end of the inductor electrode L21 is electrically connected to the electrodes E21 and E22, and the second end of the inductor electrode L21 is connected to the first end of the inductor electrode L22 through the via conductor. The second end of the inductor electrode L22 is electrically connected to the electrodes E41 and E42 through the via conductor.

The inductor electrodes L11 and L12 provided on the base material layer BML2 and BML3 define a first inductor L1. Similarly, the inductor electrodes L21 and L22 define a second inductor L2.

The first end of the inductor electrode L3 is electrically connected to the electrode E13 through the via conductor, and the second end of the inductor electrode L3 is electrically connected to the electrode E24. In addition, the second end of the inductor electrode L3 is connected to the first end of the inductor electrode L4, and the second end of the inductor electrode L4 is electrically connected to the ground conductor G1 through the via conductor.

The electrode E13 provided on the base material layer BML3 and the electrodes E11 and E12 provided on the base material layers BML2 and BML4 define a first capacitor C1. Similarly, the electrode E24 provided on the base material layer BML3 and the electrodes E21 and E22 provided on the base material layers BML2 and BML4 define a second capacitor C2. Moreover, the electrode E13 provided on the base material layer BML3 and the electrodes E31 and E32 provided on the base material layers BML2 and BML4 define a third capacitor C3. Furthermore, the electrode E24 provided on the base material layer BML3 and the electrodes E41 and E42 provided on the base material layers BML2 and BML4 define a fourth capacitor C4. FIG. 4 shows these capacitors C1 to C4 represented by a circuit symbol.

The electrodes E11 and E21 are connected to the ports P1 and P2 through the via conductor. The electrodes E31 and E41 are connected to the ports P3 and P4 through the via conductor. The ground conductor G1 is electrically connected to the ground terminal GND through the via conductor.

Since the ground conductor G1 has a mesh-shaped appearance, the stray capacitance generated between the inductor electrodes L11, L21, L12, and L22 and the ground conductor G1 is small.

Each circuit constant preferably is as follows.
L1, L2: 7.9 nH
C1, C2, C3, C4: 1.2 pF
L3: 1.65 nH
L4: 8.9 nH
k1: 0.6

Here, k1 is a coupling coefficient of the inductors L1 and L2.

Figure 5:
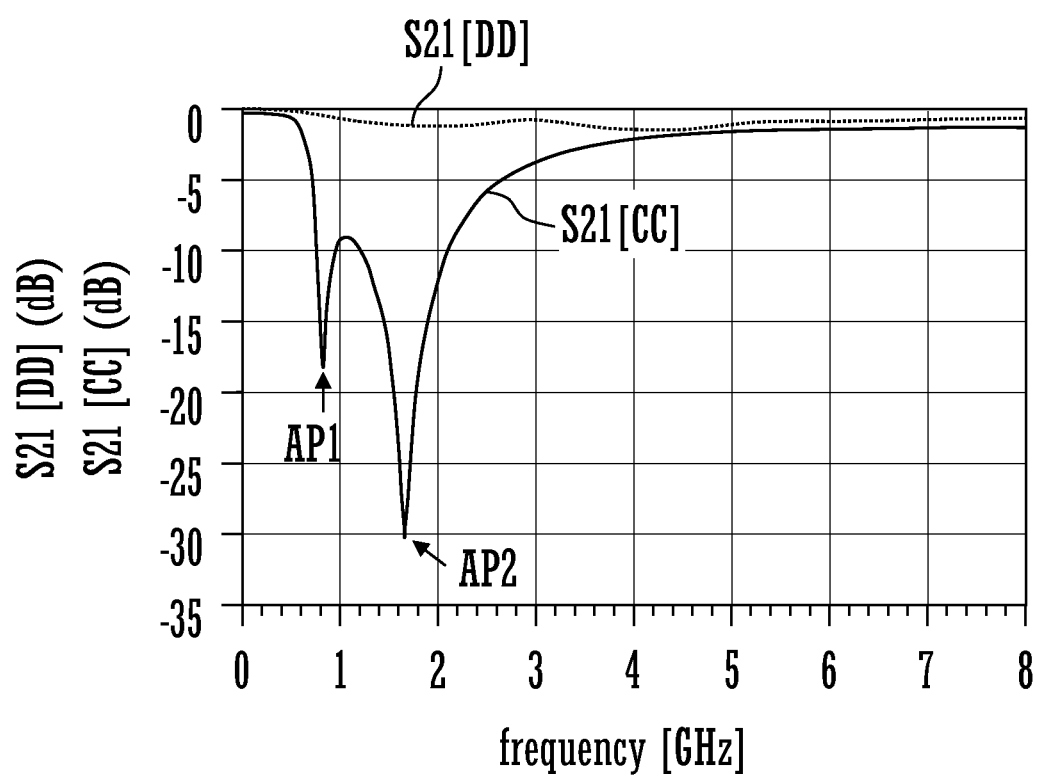
FIG. 5 is a view showing transmission characteristics S21 [CC] of the common mode noise of the common mode filter 101, and transmission characteristics S2[DD] of a differential mode signal.

FIG. 5 is a view showing transmission characteristics S21 [CC] of the common mode noise of the common mode filter 101, and transmission characteristics S21[DD] of a differential mode signal. The transmission characteristics S21[CC] of the common mode noise is significantly reduced to −9 dB over a wide band of frequency from 800 MHz to 2 GHz. The transmission characteristics S21[DD] of a differential mode signal keeps above −2 dB in all frequency bands within the frequency range shown in FIG. 5. The frequency from 800 MHz to 2 GHz is a frequency band used for mobile phones, for example. The common mode filter used for a mobile phone terminal significantly reduces the noise from 800 MHz to 2 GHz to be superimposed as common mode noise.

In FIG. 5, the attenuation pole AP1 is an attenuation pole generated by the first resonant circuit RC1 shown in FIG. 1, and the frequency of the attenuation pole AP1 is equivalent to the resonant frequency of the first resonant circuit RC1. The attenuation pole AP2 is an attenuation pole generated by the second resonant circuit RC2 shown in FIG. 1, and the frequency of the attenuation pole AP2 is equivalent to the resonant frequency of the second resonant circuit RC2. In this way, the resonant frequency of the first resonant circuit RC1 and the resonant frequency of the second resonant circuit RC2 are different from each other, and each of the frequencies corresponds to a frequency near the low frequency end and a frequency near the high frequency end in an attenuation band required for common mode noise, respectively. Therefore, the common mode noise is prevented from being propagated over a wide band. Since the cutoff frequency of the above-mentioned low pass filters LPF1 and LPF2 preferably is, for example, 8 GHz or more (ten or so GHz), the harmonic component and high frequency noise of the differential mode signal are cut off by the low pass filters LPF1 and LPF2.

According to the first preferred embodiment of the present invention, the following advantageous effects in addition to the advantageous effects that have been described are achieved.

The inductor L1 defined by the inductor electrodes L11 and L12 and the inductor L2 defined by the inductor electrodes L21 and L22 are spirally wound doubly, so that a high coupling coefficient for the small number of layers is obtained.

The electrodes E11, E21, E31, E41, E13, E24, E12, E22, E32, and E42 surround the region in which the inductors L1 and L2 are provided, so that required inductance and capacitance is provided in a limited space. In addition, undesired coupling is unlikely to occur between other elements and components, and the inductors L1 and L2.

The position in which the inductors L1 and L2 are provided and the position in which the inductors L3 and L4 are provided are not overlapped with each other in a laminating direction, and the protruding portions J31, J41, J13, J24, J32, and J42 of the electrode separate the inductors L1 and L2 from the inductors L3 and L4, so that undesired coupling between the inductors L1 and L2 and the inductors L3 and L4 is prevented.

The inductor electrodes L11, L12, L21, and L22 are arranged (localized) in a concentrated manner in a portion of the base material layer BML2 and BML3, so that the degree of coupling between the inductor L1 defined by the inductor electrodes L11 and L12 and the inductor L2 defined by the inductor electrodes L21 and L22 is increased.

The inductor electrodes L11, L12, L21, and L22 are localized in a center portion of the base material layers BML2 and BML3 and are surrounded by the electrodes E11, E21, E31, E41, E13, E24, E12, E22, E32, and E42, so that, even if another external electronic component or a metal body comes close to the common mode filter, which may cause variation in inductance value of the inductors L1 and L2, the variation is significantly reduced.

Second Preferred Embodiment

A common mode filter according to a second preferred embodiment of the present invention will be described with reference to the drawings. The circuit diagram of the common mode filter 102 according to the second preferred embodiment is the same as the circuit diagram shown in FIG. 1 in the first preferred embodiment.

Figure 6:
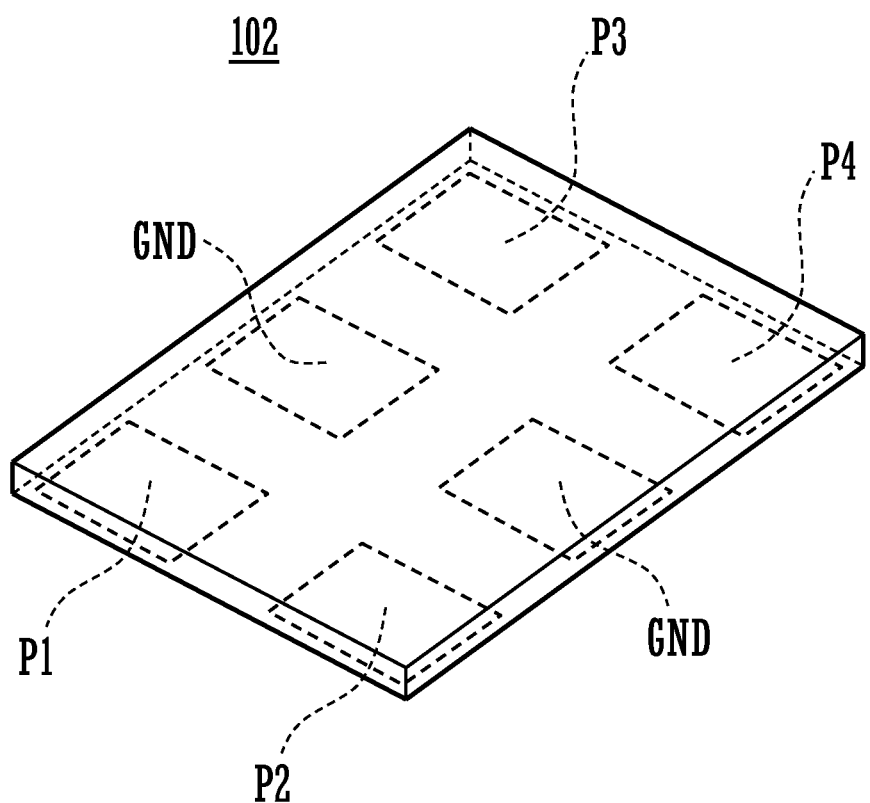
FIG. 6 is an appearance perspective view of a common mode filter 102 of a second preferred embodiment of the present invention.

FIG. 6 is an appearance perspective view of the common mode filter 102. The common mode filter 102 is a laminate of the base material layers including various conductor patterns to be described below. The common mode filter 102 includes ports P1 to P4 and a ground terminal GND on the bottom surface of the common mode filter 102.

Figure 7:
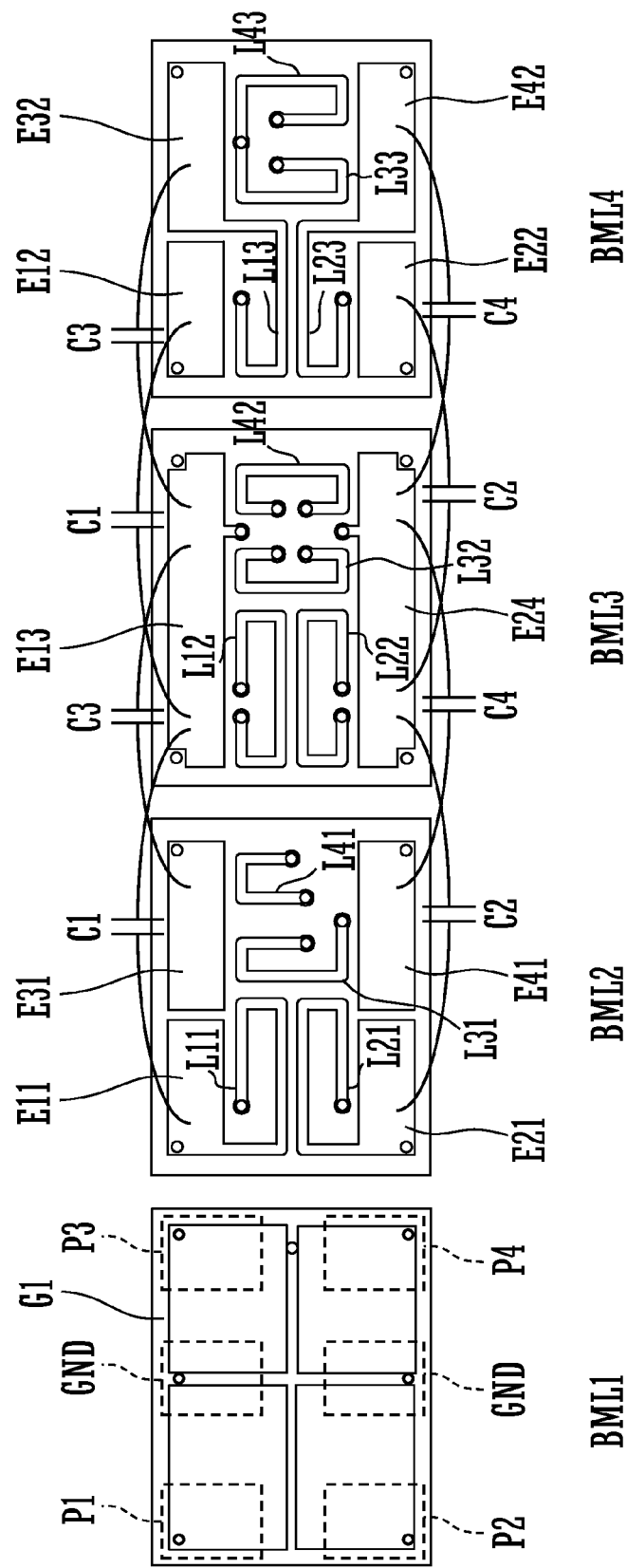
FIG. 7 is a plan view of each of pre-laminated base material layers of a laminate that defines the common mode filter 102.

FIG. 7 is a plan view of pre-laminated base material layers of a laminate that defines the common mode filter 102. The common mode filter 102 is a laminate of four base material layers BML1 to BML4 including various conductor patterns. The base material layers BML1 to BML4 are resin sheets, and the base material layer BML1 is the lowermost layer and the base material layer BML4 is the uppermost layer.

The top surface of the base material layer BML1 includes a grid-shaped ground conductor G1. The bottom surface of the base material layer BML1 includes the ports P1 to P4 and the ground terminal GND that are shown in FIG. 6.

The base material layer BML2 includes inductor electrodes L11 and L21 and electrodes E11, E21, E31, and E41. The base material layer BML3 includes inductor electrodes L12, L22, L32, and L42, and electrodes El3 and E24. The base material layer BML4 includes inductor electrodes L13, L23, L33, and L43, and electrodes E12, E22, E32, and E42.

The first end of the inductor electrode L11 is electrically connected to the electrode E11, and the second end of the inductor electrode L11 is connected to the first end of the inductor electrode L12 through a via conductor. The second end of the inductor electrode L12 is connected to the first end of the inductor electrode L13. The second end of the inductor electrode L13 is electrically connected to the electrode E32. The electrode E32 and the electrode E31 are electrically connected to each other through the via conductor. The first end of the inductor electrode L21 is electrically connected to the electrode E21, and the second end of the inductor electrode L21 is connected to the first end of the inductor electrode L22 through the via conductor. The second end of the inductor electrode L22 is connected to the first end of the inductor electrode L23 through the via conductor. The second end of the inductor electrode L23 is electrically connected to the electrode E42. The electrode E42 and the electrode E41 are electrically connected to each other through the via conductor.

The first end of the inductor electrode L31 is electrically connected to the electrode E24 through the via conductor. The second end of the inductor electrode L31 is connected to the first end of the inductor electrode E32, and the second end of the inductor electrode L32 is connected to the first end of the inductor electrode L33 through the via conductor. The second end of the inductor electrode L33 is electrically connected to the electrode E13 through the via conductor. The first end of the inductor electrode L41 is connected to the first end of the inductor electrode L42 through the via conductor. The second end of the inductor electrode L41 is electrically connected to the ground conductor G1 through the via conductor. The second end of the inductor electrode L42 is connected to the first end of the inductor electrode L43, and the second end of the inductor electrode L43 is electrically connected to the electrode E13 through the via conductor.

The inductor electrodes L11, L12, and L13 provided on the base material layers BML2, BML3, and BML4 define a first inductor L1. Similarly, the inductor electrodes L21, L22 and L23 define a second inductor L2.

The inductor electrodes L31, L32, and L33 provided on the base material layers BML2, BML3, and BML4 define a third inductor L3. Similarly, the inductor electrodes L41, L42 and L43 define a fourth inductor L4.

The electrode E13 provided on the base material layer BML3 and the electrodes E11 and E12 provided on the base material layers BML2 and BML4 define a first capacitor C1. Similarly, the electrode E24 provided on the base material layer BML3 and the electrodes E21 and E22 provided on the base material layers BML2 and BML4 define a second capacitor C2. In addition, the electrode E13 provided on the base material layer BML3 and the electrodes E31 and E32 provided on the base material layers BML2 and BML4 define a third capacitor C3. Moreover, the electrode E24 provided on the base material layer BML3 and the electrodes E41 and E42 provided on the base material layers BML2 and BML4 define a fourth capacitor C4. FIG. 7 shows these capacitors C1 to C4 represented by a circuit symbol.

The electrodes E11 and E21 are connected to the ports P1 and P2 through the via conductor. The electrodes E31 and E41 are connected to the ports P3 and P4 through the via conductor. The ground conductor G1 is electrically connected to the ground terminal GND through the via conductor.

It should be noted that the ground conductor G1 preferably is not simply a linear conductor but a grid-shaped conductor, so that the ground conductor G1 equivalently defines and functions as a planar conductor, which has a size of an outer frame. Thus, an unnecessary inductance component is hardly generated.

As described above, while the circuit diagram of the common mode filter 102 is the same as the circuit diagram shown in FIG. 1 in the first preferred embodiment, the circuit constants are different.

Each circuit constant preferably is as follows.

L1, L2: 7.9 nH
C1, C2, C3, C4: 1.4 pF
L3: 3.4 nH
L4: 6.7 nH
k1: 0.3

Figure 8:
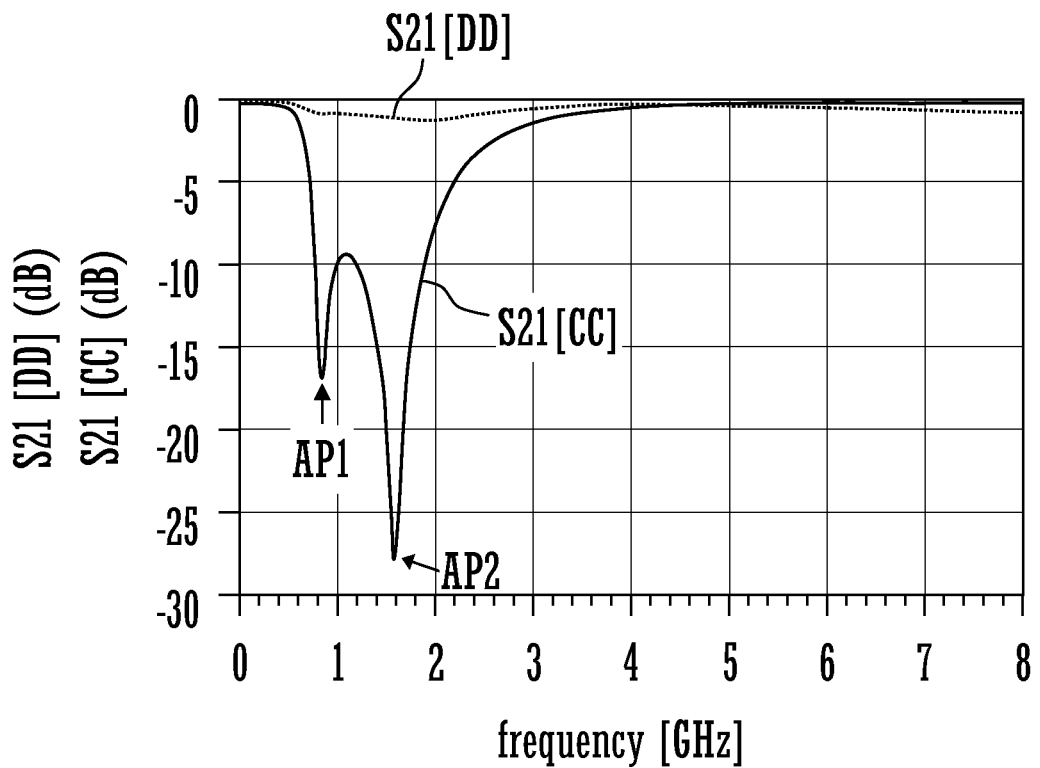
FIG. 8 is a view showing transmission characteristics S21 [CC] of the common mode noise of the common mode filter 102, and transmission characteristics S21[DD] of a differential mode signal.

FIG. 8 is a view showing transmission characteristics S21 [CC] of the common mode noise of the common mode filter 102, and transmission characteristics S21[DD] of a differential mode signal. The transmission characteristics S21[CC] of the common mode noise is significantly reduced to about −9 dB over a wide band of frequency from 800 MHz to 1.8 GHz, for example. The transmission characteristics S21[DD] of a differential mode signal keeps above about −2 dB in all frequency bands within the frequency range shown in FIG. 8, for example. In this way, even when the coupling coefficient k1 of the inductors L1 and L2 is significantly smaller than the coupling coefficient of a conventional common mode choke coil, the reduced amount and the frequency band of the common mode noise are obtained.

Since the common mode filter 102 according to the second preferred embodiment includes the inductors L1, L2, L3, and L4 that are provided over three layers, the line width of the inductor electrode including the inductors L1, L2, L3, and L4 can be made thicker, which significantly reduces conductor loss.

Third Preferred Embodiment

Figure 9:
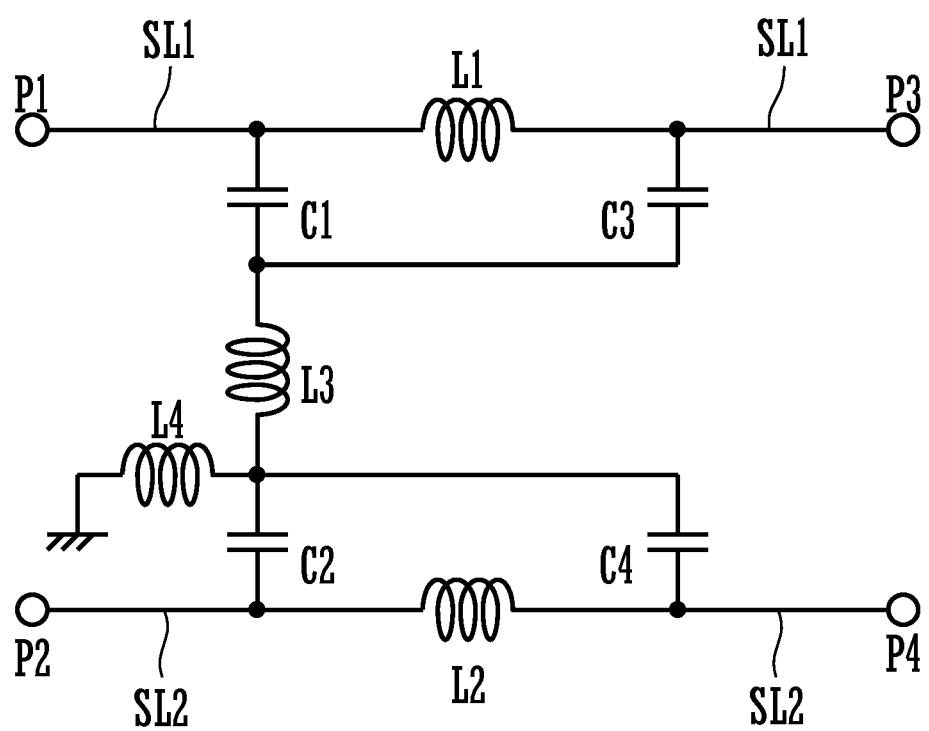
FIG. 9 is a circuit diagram of a common mode filter 103 according to a third preferred embodiment of the present invention.

FIG. 9 is a circuit diagram of a common mode filter 103 according to a third preferred embodiment of the present invention. While the common mode filter 103 has a basic circuit configuration similar to the circuit configuration of the common mode filter 101 shown in FIG. 1 in the first preferred embodiment, the first inductor L1 and the second inductor L2 are not positively coupled to each other in a magnetic field. In other words, the first inductor L1 and the second inductor L2 do not act as a common mode choke coil.

Even in such a common mode filter 103, the first capacitor C1, the third inductor L3, and the fourth inductor L4 define a first resonant circuit RC1, and the second capacitor C2 and the fourth inductor L4 define a second resonant circuit RC2. In addition, the inductors L1 and L2 and the capacitors C1, C3, C2, and C4 mainly define a low pass filter. Therefore, the first resonant circuit RC1 and the second resonant circuit RC2 prevent the common mode noise from propagating. Moreover, the differential mode signal of a frequency lower than the cutoff frequency of the low pass filter passes the signal lines SL1 and SL2.

Fourth Preferred Embodiment

Figure 10:
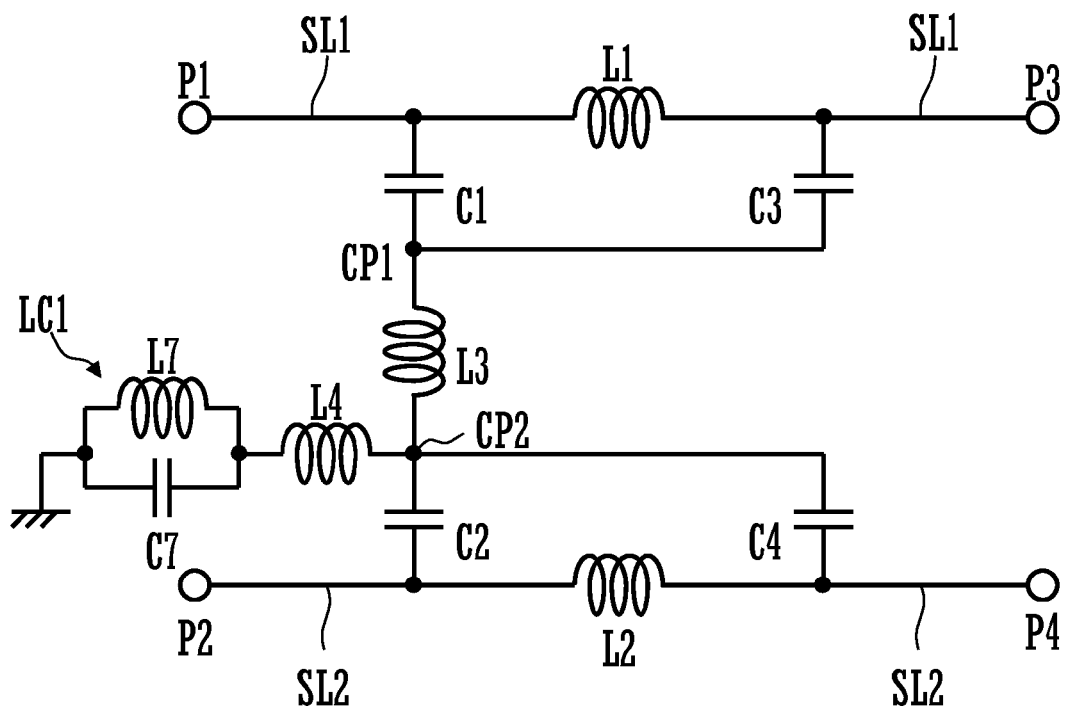
FIG. 10 is a circuit diagram of a common mode filter 104 according to a fourth preferred embodiment of the present invention.

FIG. 10 is a circuit diagram of a common mode filter 104 according to a fourth preferred embodiment of the present invention. Between the connection point CP2 of the third inductor L3 and the second capacitor C2, and a ground, a series circuit of the fourth inductor L4 and an LC parallel circuit LC1 is provided. Other configurations are the same as the configuration shown in FIG. 1 in the first preferred embodiment.

The LC parallel circuit LC1 is a parallel circuit including an inductor L7 and a capacitor C7. The LC parallel circuit LC1 preferably defines a trap. In a trap frequency, the series resonance of the inductor L4 and the capacitor C7 causes the connection point CP2 to be substantially ground potential. Since the impedance of the capacitor C7 is high in a frequency band lower than the trap frequency, the series circuit defines and functions as a series circuit of the inductors L4 and L7. Since the impedance of the capacitor C7 is low in a frequency band higher than the trap frequency, the inductor L4 becomes dominant in the series circuit.

Figure 11:
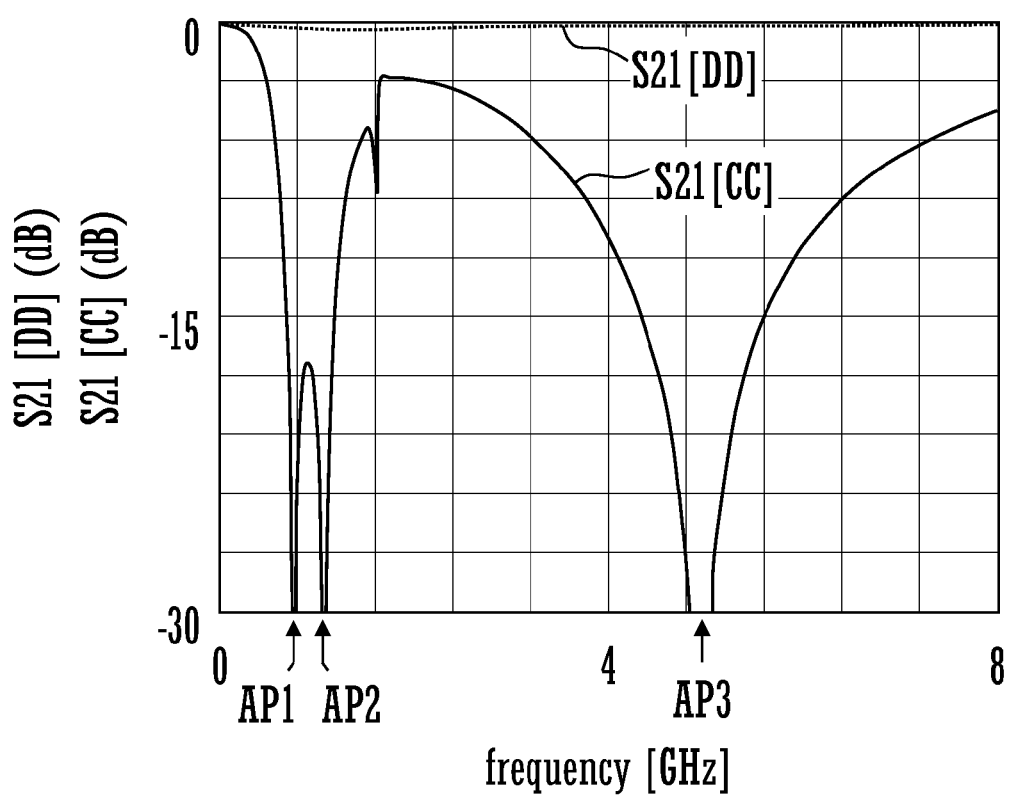
FIG. 11 is a view showing transmission characteristics S21 [CC] of the common mode noise of the common mode filter 104, and transmission characteristics S21[DD] of a differential mode signal.

FIG. 11 is a view showing the transmission characteristics S21[CC] of the common mode noise of the common mode filter 104, and the transmission characteristics S21[DD] of a differential mode signal. The common mode noise is attenuated over a wide band by two attenuation poles AP1 and AP2. In addition, the trap generates an attenuation pole AP3. Therefore, the propagation of the common mode noise is significantly reduced also in a frequency band by the attenuation pole AP3.

Fifth Preferred Embodiment

Figure 12:
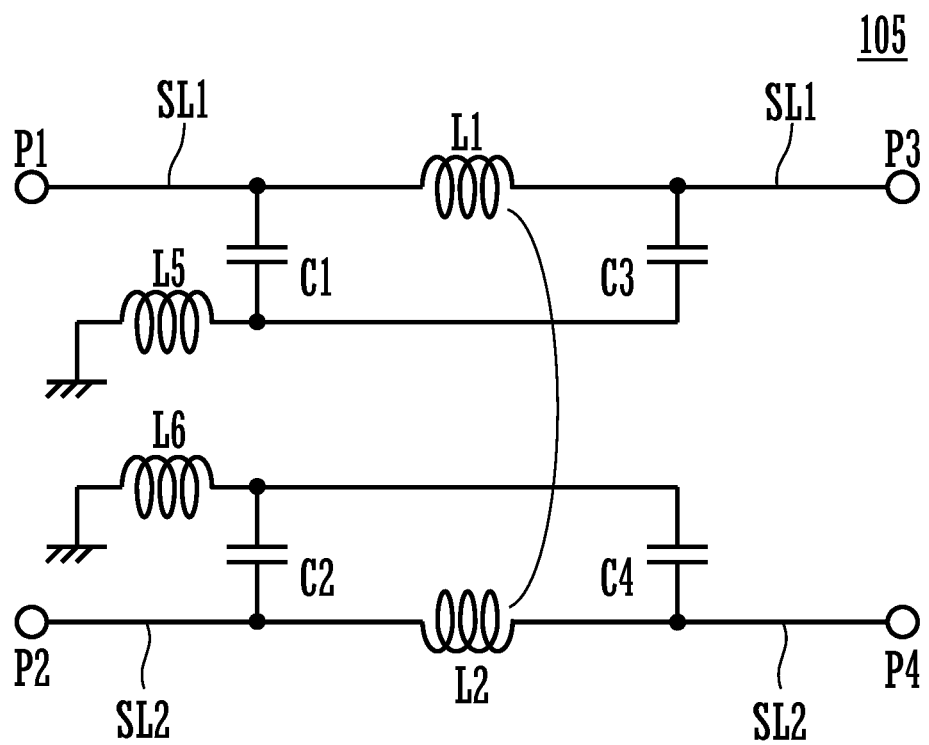
FIG. 12 is a circuit diagram of a common mode filter according to a fifth preferred embodiment of the present invention.

FIG. 12 is a circuit diagram of a common mode filter 105 according to a fifth preferred embodiment of the present invention. Unlike the circuit shown in FIG. 1 in the first preferred embodiment, the circuit includes a fifth inductance element (hereinafter referred to as a "fifth inductor") L5 between the first capacitor C1 and the ground, and a sixth inductance element (hereinafter referred to as a "sixth inductor") L6 between the second capacitor C2 and the ground. In the preferred embodiment, the inductance of the fifth inductor L5 and the inductance of the sixth inductor L6 preferably are different from each other. In other words, the series resonance frequency of (C1-L5) or (C3-L5) and the series resonance frequency of (C2-L6) or (C4-L6) are different from each other.

In this way, even if the inductors L5 and L6 having different inductances are individually connected, the equivalent characteristics are obtained. In addition, a trap preferably is provided by connecting in series the LC parallel circuit as shown in FIG. 10 to the inductors L5 and L6, respectively. This, as shown in FIG. 11, attenuates (traps) a predetermined frequency band.

Sixth Preferred Embodiment

A sixth preferred embodiment of the present invention shows an example of a common mode filter in which an inductance element in addition to a first inductance element and a second inductance element is provided in series with respect to the first signal line and the second signal line.

Figure 13A:
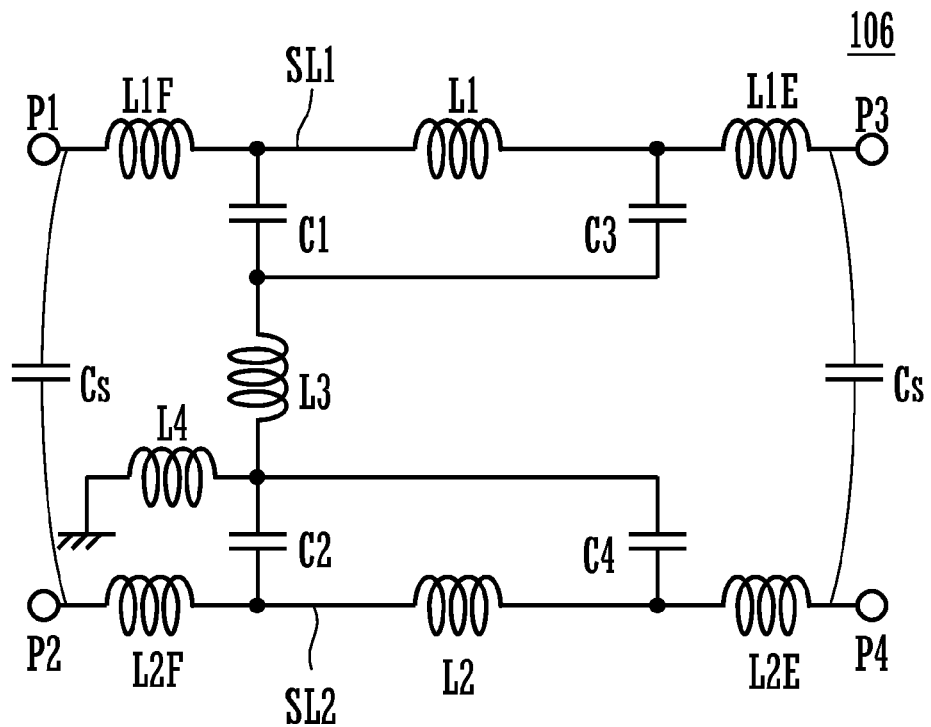
FIG. 13A is a circuit diagram of a common mode filter 106 according to a sixth preferred embodiment of the present invention and FIG. 13B is a circuit diagram of a common mode filter as a comparative example.
Figure 13B:
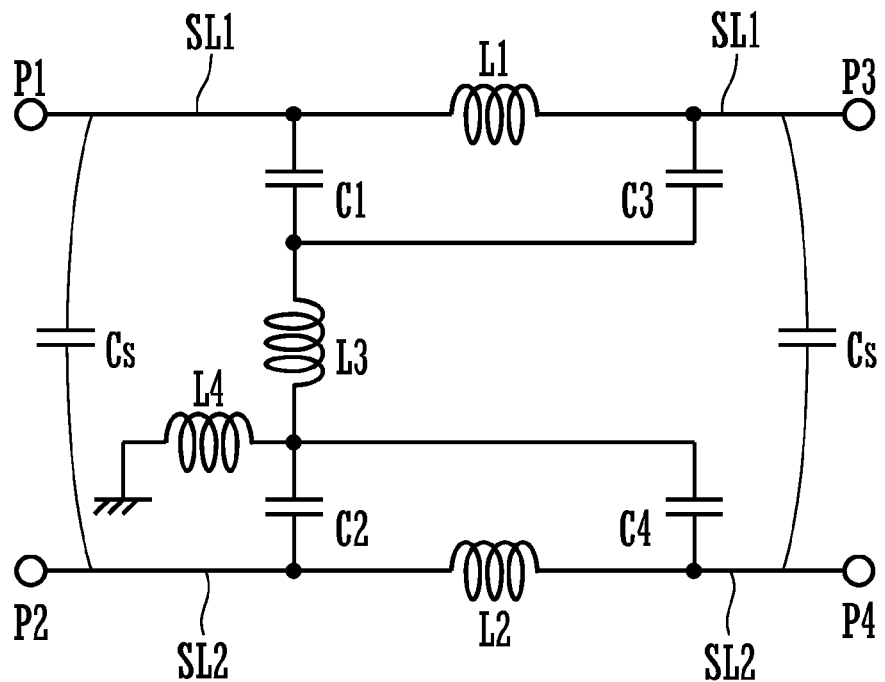

FIG. 13A is a circuit diagram of a common mode filter 106 according to the sixth preferred embodiment and FIG. 13B is a circuit diagram of a common mode filter as a comparative example. The common mode filter in the comparative example shown in FIG. 13B, when being represented by a lumped constant circuit, is the same circuit as the circuit shown in FIG. 1 or FIG. 9. When such a common mode filter is provided in a laminate, parasitic capacitance Cs is generated between ports (terminals). Since the parasitic capacitance Cs is connected in parallel to the capacitors C1 to C4, the cutoff frequency of the low pass filter defined by these capacitors, the first inductor L1, and the second inductor L2 is decreased. In a frequency band higher than this cutoff frequency, differential impedance is shifted from a predetermined value, which causes a problem that the frequency band that can be used as a common mode filter is narrower.

In view of the above-described problems, in the present preferred embodiment of the present invention, as shown in FIG. 13A, a first port side inductance element L1F is arranged between the first port P1 as a first end on the input side of the differential transmission lines SL1 and SL2 and the first inductor L1, and a second port side inductance element L2F is arranged between the second port P2 as a second end on the input side of the differential transmission lines SL1 and SL2 and the second inductor L2. Similarly, a third port side inductance element L1E is arranged between the third port P3 as a first end on the output side of the differential transmission lines SL1 and SL2 and the first inductor L1, and a fourth port side inductance element L2E is arranged between the fourth port P4 as a second end on the output side of the differential transmission lines SL1 and SL2 and the second inductor L2. This provides a five-stage (three inductors and two capacitors) low pass filter defined by the inductance elements L1F, L2F, L1E, and L2E, the inductors L1 and L2, and the capacitors C1, C2, C3, and C4. By determining the inductance of the inductance elements L1F, L2F, L1E, and L2E, the inductance of the first inductor L1 and the second inductor L2, and the capacitance of the capacitors C1, C2, C3, and C4, the cutoff frequency of the low pass filter is set to be a frequency higher than the frequency band that is being used.

Each circuit constant in FIG. 13A is as follows.

L1, L2: 13.6 nH
C1, C2, C3, C4: 1.2 pF
L3: 3.0 nH
L4: 2.5 nH
k1: 0.3
L1F, L2F, L1E, L2E: 1.2 nH
Cs: 0.15 pF

Here, k1 is a coupling coefficient of the inductors L1 and L2.

Figure 14A:
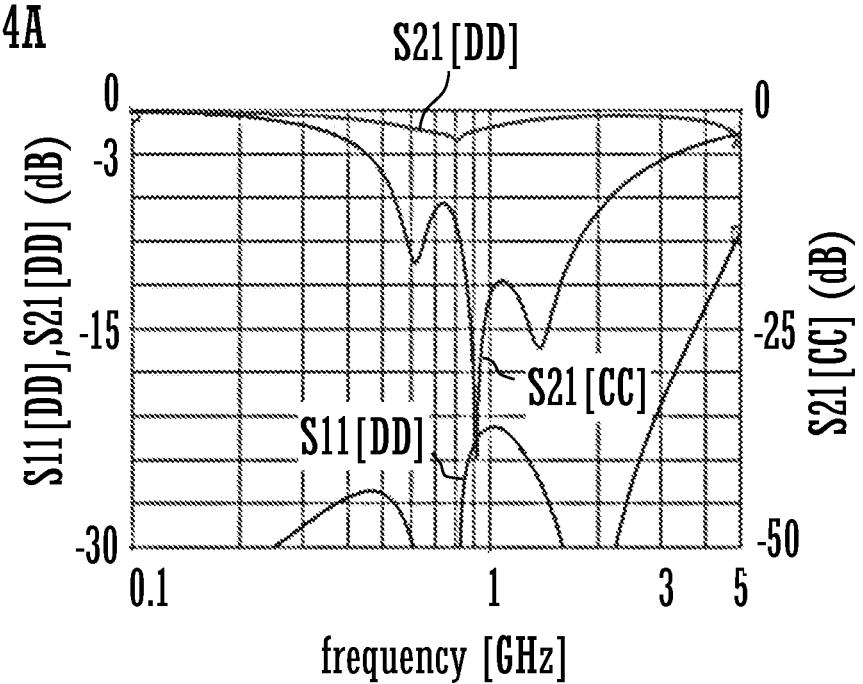
FIG. 14A is a view showing frequency characteristics of the common mode filter shown in FIG. 13A.
Figure 14B:
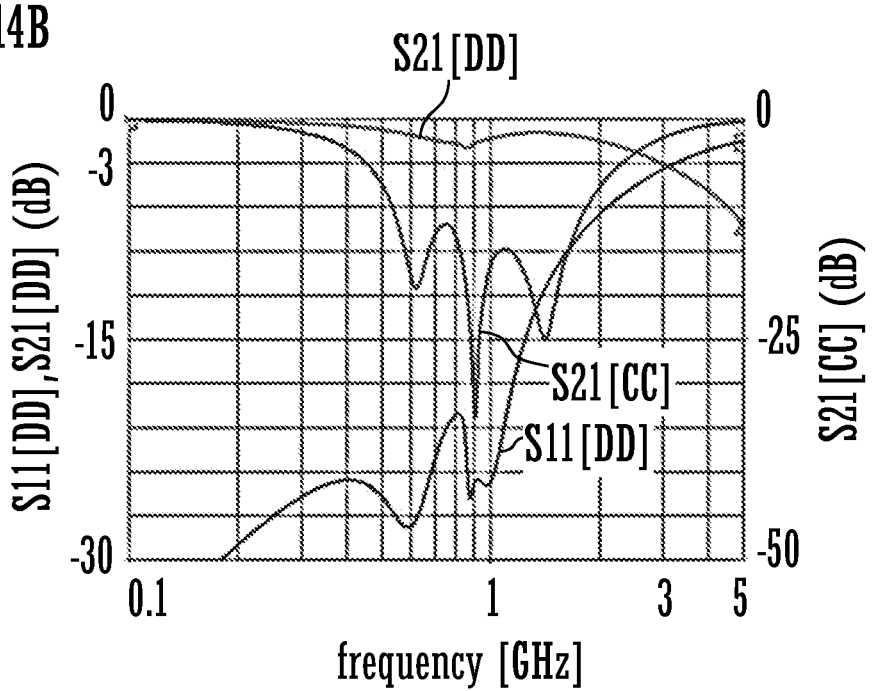
FIG. 14B is a view showing frequency characteristics of the common mode filter shown in FIG. 13B.

FIG. 14A is a view showing the frequency characteristics (transmission characteristics S21[CC] of the common mode noise, the transmission characteristics S21[DD] of a differential mode signal, and the reflection characteristics of the differential mode signal S11[DD]) of the common mode filter shown in FIG. 13A. FIG. 14B is a view showing the frequency characteristics of the common mode filter shown in FIG. 13B. In the present preferred embodiment, the frequency characteristics of the common mode filter as a comparative example shown in FIG. 13B has been calculated excluding the inductors L1F, L2F, L1E, and L2E in FIG. 13A.

Without the inductors L1F, L2F, L1E, and L2E in the input and output portions, as shown in FIG. 14B, the −3 dB band of the transmission characteristics S21[DD] extends only up to 3 GHz. In other words, the differential impedance of the common mode filter has shifted in a frequency band higher than 3 GHz. This results from the fact that a three-stage (one inductor and two capacitors) low pass filter is provided without the inductors L1F, L2F, L1E, and L2E in the input and output portions, the stray capacitance Cs and the capacitors C1 to C4 (1.2 pF) are connected in parallel to each other, the total capacity of the low pass filter becomes larger, and the cutoff frequency of the low pass filter becomes lower.

In contrast, in the common mode filter according to the present preferred embodiment, as shown FIG. 14A, the transmission characteristics S21[DD] and the reflection characteristics S11[DD] extend up to a band exceeding 5 GHz. Accordingly, the common mode filter is applicable to a higher band.

Figure 15A:
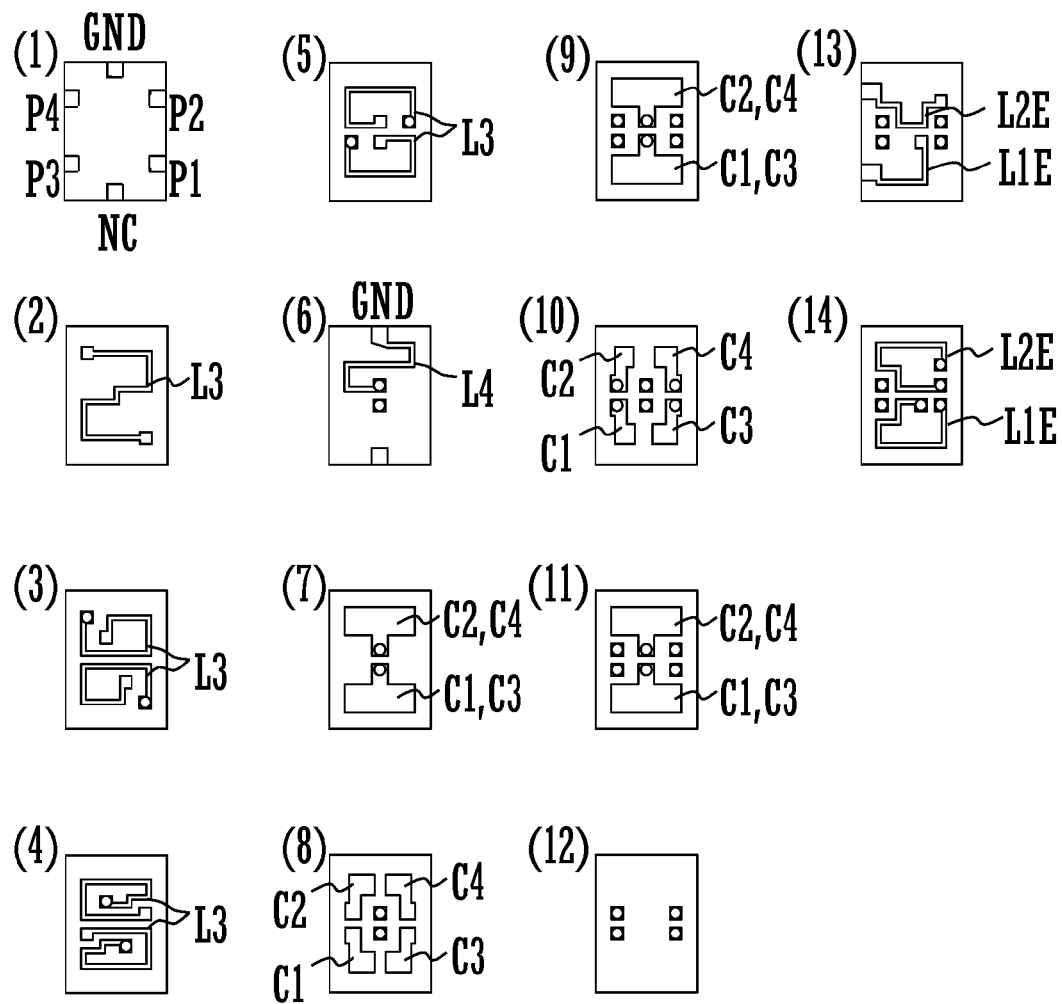
FIG. 15A is a view showing a conductor pattern of each layer in a case in which the common mode filter according to a sixth preferred embodiment of the present invention is provided in a laminate.
Figure 15B:
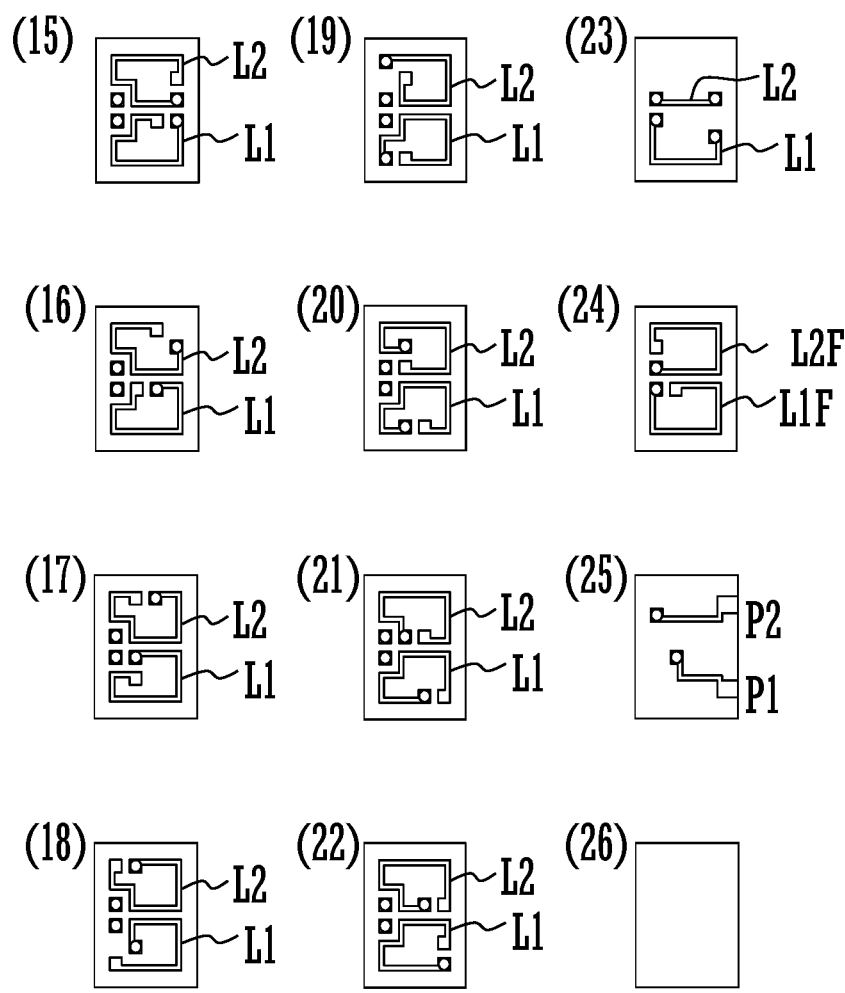
FIG. 15B is a view showing a conductor pattern of each layer in a case in which the common mode filter according to the sixth preferred embodiment of the present invention is provided in a laminate and a view that follows FIG. 15A.

FIG. 15A and FIG. 15B are views showing a conductor pattern of each layer in a case in which a common mode filter according to a sixth preferred embodiment of the present invention is provided in a laminate. These views are plan views of the bottom surface of each layer. The first layer (1) is equivalent to the mounting surface and the twenty-sixth layer (26) is equivalent to the top surface. Each reference numeral in the drawings corresponds to each of the reference numerals shown in FIG. 13A. The inductor L3 is provided over the second layer (2) to the fifth layer (5). The capacitors C1, C2, C3, and C4 are provided over the seventh layer (7) to the eleventh layer (11). The inductors L1E and L2E are provided over the thirteenth layer (13) to the fourteenth layer (14). Moreover, the inductors L1 and L2 are provided over the fifteenth layer (15) to the twenty-third layer (23).

According to the present preferred embodiment of the present invention, the differential impedance in the frequency band being used is prevented from shifting and the frequency characteristics of a common mode filter are improved.

Other Preferred Embodiments

While the above preferred embodiments of the present invention have shown examples in which the ports P1 to P4 for mounting and the ground terminal GND that are provided on the bottom surface of the rectangular or substantially rectangular plate-shaped laminate are connected to the internal electrodes through the via conductor, the port for mounting and the terminal may be connected to the internal electrode through the side portion (end surface) of the laminate.

While the above preferred embodiments of the present invention have shown examples in which the rectangular or substantially rectangular plate-shaped laminate includes the common mode filter, a portion of the high frequency line may include the common mode filter. For example, a plurality of base material layers including a base material layer including a ground conductor and a base material layer including a signal line may be laminated to provide an elongated high frequency cable, and the configurations shown in FIG. 2 or FIG. 6 may be embedded in a portion of the high frequency cable to provide a flat high frequency cable with a built-in common mode filter. In such a case, the ports P1 to P4 for mounting and the ground terminal are not necessary at least in the region in which the common mode filter is provided.

While the above preferred embodiments of the present invention have shown examples in which the laminate includes the various conductor patterns preferably formed by printing conductive paste on each of the base material layers, the various conductor patterns may be formed by the thin film forming method or other suitable methods, for example.

While the above preferred embodiments of the present invention have shown examples in which the resonant frequencies of the first resonant circuit RC1 and the second resonant circuit RC2 preferably are different from each other, the preferred embodiments of the present invention do not exclude a configuration in which the resonant frequencies of the two resonant circuits are identical with each other. However, when the resonant frequencies of the first resonant circuit RC1 and the second resonant circuit RC2 are identical with each other, the frequencies of the attenuation poles AP1 and AP2 shown in FIG. 5 or FIG. 8 are identical with each other. Therefore, the frequency band that significantly reduces a common mode noise is narrower, and the amount of attenuation is also reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A common mode filter comprising:
    a differential transmission line including a first signal line and a second signal line, a first inductance element arranged in series in the first signal line, a second inductance element arranged in series in the second signal line, and a ground defining a reference with respect to the first signal line and the second signal line;
    a first resonant circuit arranged between the first inductance element and the ground; and
    a second resonant circuit arranged between the second inductance element and the ground; wherein
    the first resonant circuit includes a first LC series circuit including a first capacitance element connected to the first inductance element;
    the second resonant circuit includes a second LC series circuit including a second capacitance element connected to the second inductance element;
    the common mode filter includes:
        a first line connecting the first capacitance element to the second capacitance element; and a second line branched from the first line and connecting the first line to the ground;

the first LC series circuit includes:
    a third inductance element arranged in series in the first line; and
    a fourth inductance element arranged in series in the second line;

the second LC series circuit includes the fourth inductance element; and a resonant frequency of the first resonant circuit and a resonant frequency of the second resonant circuit are frequencies at which the first resonant circuit and the second resonant circuit attenuate a common mode noise entering the differential transmission line, and the resonant frequencies of the first resonant circuit and the second resonant circuit are different from each other.

2. The common mode filter according to claim 1, wherein another inductance element is provided in series between the first signal line and the second signal line.

3. The common mode filter according to claim 1, wherein a fifth inductance element is provided between the first capacitance element and the ground, and a sixth inductance element is provided between the second capacitance element and the ground.

4. The common mode filter according to claim 1, wherein the first resonant circuit or the second resonant circuit includes an LC parallel circuit.

5. The common mode filter according to claim 1, wherein the differential transmission line includes:
    a first port that is a first end on an input side of the differential transmission line;
    a second port that is a second end on the input side;
    a third port that is a first end on an output side of the differential transmission line;
    a fourth port that is a second end on the output side;
    a first port side inductance element arranged between the first port and the first inductance element;
    a second port side inductance element arranged between the second port and the second inductance element;
    a third port side inductance element arranged between the third port and the first inductance element; and
    a fourth port side inductance element arranged between the fourth port and the second inductance element.

6. The common mode filter according to claim 1, wherein the first inductance element, the second inductance element, the first resonant circuit, and the second resonant circuit are integrally configured in a laminate including a plurality of base material layers laminated on each other.

7. The common mode filter according to claim 6, wherein a first surface of one of the base material layers includes a grid-shaped ground conductor and a second surface of the one of the base material layers includes a plurality of ports and the ground.

8. The common mode filter according to claim 6, wherein the ground includes a mesh-shaped ground conductor or a grid-shaped ground conductor.

9. The common mode filter according to claim 1, wherein the first resonant circuit and the second resonant circuit define a trap filter.

10. The common mode filter according to claim 1, further comprising:
    first and second low pass filters; wherein
    the first low pass filter is arranged in the first signal line and includes the first inductance element and the first resonant circuit; and
    the second low pass filter is arranged in the second signal line and includes the second inductance element and the second resonant circuit.

11. The common mode filter according to claim 1, wherein the common mode filter is configured to have bi-directionality.

12. The common mode filter according to claim 1, wherein
    the first inductance element, the second inductance element, the first resonant circuit, and the second resonant circuit are integrally configured in a laminate including a plurality of base material layers laminated on each other;
    the first inductance element and the second inductance element each include an inductor electrode;
    the first capacitance element and the second capacitance element each include a capacitor electrode; and
    the inductor electrode of the first inductance element or the second inductance element is surrounded by the capacitor electrodes of the first capacitance element and the second capacitance element.

13. The common mode filter according to claim 1, wherein the first inductance element and the second inductance element are not positively coupled to each other in a magnetic field.

14. The common mode filter according to claim 1, wherein between a connection point of the third inductance element and the second capacitance element, and the ground, a series circuit of the fourth inductance element and an LC parallel circuit is provided.

* * * * *